(12) United States Patent
Finan (10) Patent No.: US 9,255,968 B2
(45) Date of Patent: Feb. 9, 2016

(54) INTEGRATED CIRCUIT WITH A HIGH-SPEED DEBUG ACCESS PORT

(71) Applicant: Altera Corporation, San Jose, CA (US)

(72) Inventor: Christopher D. Finan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 106 days.

(21) Appl. No.: 14/087,690

(22) Filed: Nov. 22, 2013

(65) Prior Publication Data

US 2015/0149843 A1 May 28, 2015

(51) Int. Cl.
*G01R 31/3185* (2006.01)
*G01R 31/317* (2006.01)

(52) U.S. Cl.
CPC .. *G01R 31/318519* (2013.01); *G01R 31/31705* (2013.01)

(58) Field of Classification Search
CPC ............................................... G01R 31/318516
USPC ...................... 714/726, 700, 730, 703, 30, 39
See application file for complete search history.

(56) References Cited

U.S. PATENT DOCUMENTS

| 5,483,640 | A * | 1/1996 | Isfeld et al. ................... 709/213 |
| 6,903,582 | B2 * | 6/2005 | Gaskins et al. ............... 327/141 |
| 8,415,974 | B1 * | 4/2013 | Lysaght .......................... 326/39 |
| 2004/0008713 | A1 * | 1/2004 | Knight et al. ................. 370/428 |
| 2013/0339790 | A1 * | 12/2013 | Menon et al. ................... 714/30 |
| 2014/0204774 | A1 * | 7/2014 | Schulz et al. ................. 370/252 |

OTHER PUBLICATIONS

"Quartus II Handbook Version 12.1 vol. 3: Verification" Nov. 2012, Altera Corporation.

* cited by examiner

*Primary Examiner* — Fritz Alphonse (57) ABSTRACT

An integrated circuit with a high-speed debug access port includes interface circuitry and a dedicated debug port in the interface circuitry. The interface circuitry includes a function circuit block that is used to receive a data packet from external circuitry coupled to the integrated circuit. The dedicated debug port is coupled to the function circuit block and is used to transmit the received data packet to debug circuitry on the integrated circuit. The interface circuitry may include a peripheral component interconnect express (PCIe) interface circuit.

20 Claims, 6 Drawing Sheets

INTEGRATED CIRCUIT WITH A HIGH-SPEED DEBUG ACCESS PORT

BACKGROUND

Programmable integrated circuit devices such as field programmable gate array (FPGA) and complex programmable logic device (CPLD) devices may be loaded or configured with a user design to perform any of a variety of functions. Generally, electronic design automation (EDA) tools are used by circuit designers or design engineers to create circuit designs (commonly referred to as user designs) for integrated circuit devices.

When designing a circuit, a circuit designer or design engineer may debug their design using the EDA tool. As an example, the EDA tool may automatically insert debug circuitry into a user design. When the user design is compiled together with the inserted debug circuitry, the user may perform debugging operations on the design via a Joint Test Action Group (JTAG) port available on the integrated circuit device.

Apart from using the JTAG port, the integrated circuit may be debugged via other interfaces such as the Peripheral Component Interconnect Express (PCIe) interface standard. However, the user or circuit designer may need to include specific debug traffic circuitry, such as multiplexing and demultiplexing circuits, to allow the PCIe interface to be used for debugging purposes.

Additionally, the user may need to set aside addresses within the PCIe device's address space to be used for its debug logic. This may involve adding an additional Base Address Register (BAR) to the user's PCIe function or expanding the size of one of the user's existing BARs. As such, although the PCIe interface may allow relatively faster debugging access compared to the typical JTAG interface, substantial modifications to a user design may be needed in order for the PCIe interface to be used for debugging a user design.

SUMMARY

Techniques and circuitry for debugging user designs via a high-speed interface such as the Peripheral Component Interconnect Express (PCIe) interface are disclosed. Embodiments of the present invention include methods to insert a debug connection into a user design without modifying the user's underlying register-transfer level (RTL) design.

It is appreciated that the present invention can be implemented in numerous ways, such as a process, an apparatus, a system, a device or a computer readable medium. Several inventive embodiments of the present invention are described below.

An integrated circuit with a high-speed debug access port includes interface circuitry with a function circuit block that receives a data packet from external circuitry. As an example, the interface circuitry may include circuitry for the PCIe interface. The interface circuitry further includes a dedicated debug port coupled to the function circuit block. The dedicated debug port transmits the received data packet to debug circuitry on the integrated circuit.

A method for providing debugging capability in an integrated circuit with an electronic design automation (EDA) tool includes providing a dedicated debug port in a high speed serial interface circuit on the integrated circuit. The method further includes providing a function block to access the dedicated debug port in the high speed serial interface circuit. A user design with debug circuitry is compiled to form debugging paths from the debug circuitry in the user design to the dedicated debug port.

A method of operating an integrated circuit includes receiving debugging signals from external circuitry at a dedicated debug function circuit block in a high speed serial interface circuit. The debugging signals are transmitted to a dedicated debug port in the high speed serial interface circuit. Accordingly, the debugging signals are transmitted to debug circuitry on the integrated circuit via the dedicated debug port in the high speed serial interface circuit. In one embodiment, the debugging signals may be transmitted with a direct memory access (DMA) controller circuit.

DETAILED DESCRIPTION

The embodiments provided herein include techniques to debug an integrated circuit design.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
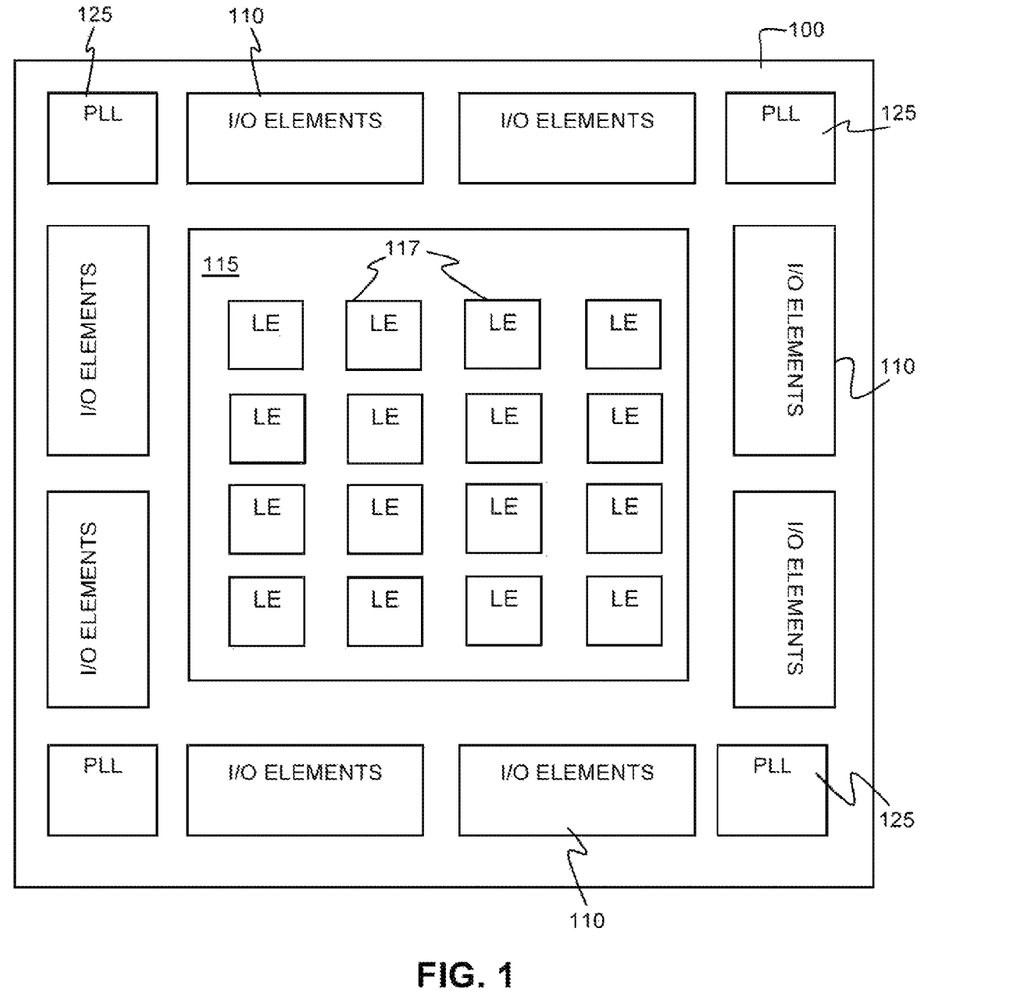
FIG. 1 is a simplified block diagram of an integrated circuit in accordance with embodiments of the present invention.

An IC device such as a field-programmable gate array (FPGA) device or an application specific integrated circuit (ASIC) device, generally includes, among others, memory modules, logic blocks, clock generation circuitry, and input-output elements. FIG. 1, meant to be illustrative and not limiting, shows a simplified block diagram of IC 100. IC 100 includes core logic region 115 and input-output elements 110. It should be appreciated that a single device like IC 100 can potentially support a variety of different interfaces and each individual input-output bank 110 can support a different input-output standard with a different interface or protocol such as the Peripheral Component Interconnect Express (PCIe) protocol.

Other circuits, such as phase-locked loops (PLLs) 125, for clock generation and timing, may also be located outside core logic region 115 (e.g., at corners of IC 100 or adjacent to input-output elements 110). Integrated circuit (IC) devices generally use a clock signal to synchronize different circuit elements in the device. As such, IC 100 may include a clock network (not shown) that may be used to transmit clock signals from clock circuits (e.g., PLLs 125) to various parts of IC 100.

Signals received from external circuitry at input-output elements 110 may be routed from input-output elements 110 to core logic region 115, PLLs 125 or other logic blocks (not shown) on IC 100. Core logic region 115 (or more specifically, logic elements (LEs) 117 or core registers within core logic region 115) may perform functions based on the signals received. Accordingly, signals may be sent from core logic region 115 and other relevant logic blocks of IC 100 to other external circuitry or components that may be connected to IC 100 through input-output elements 110.

As shown in FIG. 1, core logic region 115 may be populated with logic cells that may include LEs 117 or core registers, among other circuits. The LEs may further include look-up table-based logic regions and may be grouped into "Logic Array Blocks" (LABs). The LEs and groups of LEs or LABs can be configured to perform logical functions desired by a user or circuit designer.

As an example, a circuit designer may design a circuit that performs specific logic functions. Typically, a circuit designer may use an electronic design automation (EDA) tool when designing a circuit. The process of designing a circuit to be implemented on an IC device such as IC 100 may be done in several steps with a typical EDA tool. The EDA tool may accordingly produce an output file (e.g., a configuration file) that is then used to configure the IC device with the user design. Alternatively, the EDA tool may also produce an output file (e.g., a binary file) to generate masks (based on the user design) for an IC device. As part of the design flow, the EDA tool may accordingly insert debugging circuitry that allows the circuit designer to debug the circuit design. After the circuit design is debugged, the circuit designer may make adjustments (if needed) to updated circuit design before loading the updated circuit design to the IC device.

Figure 2:
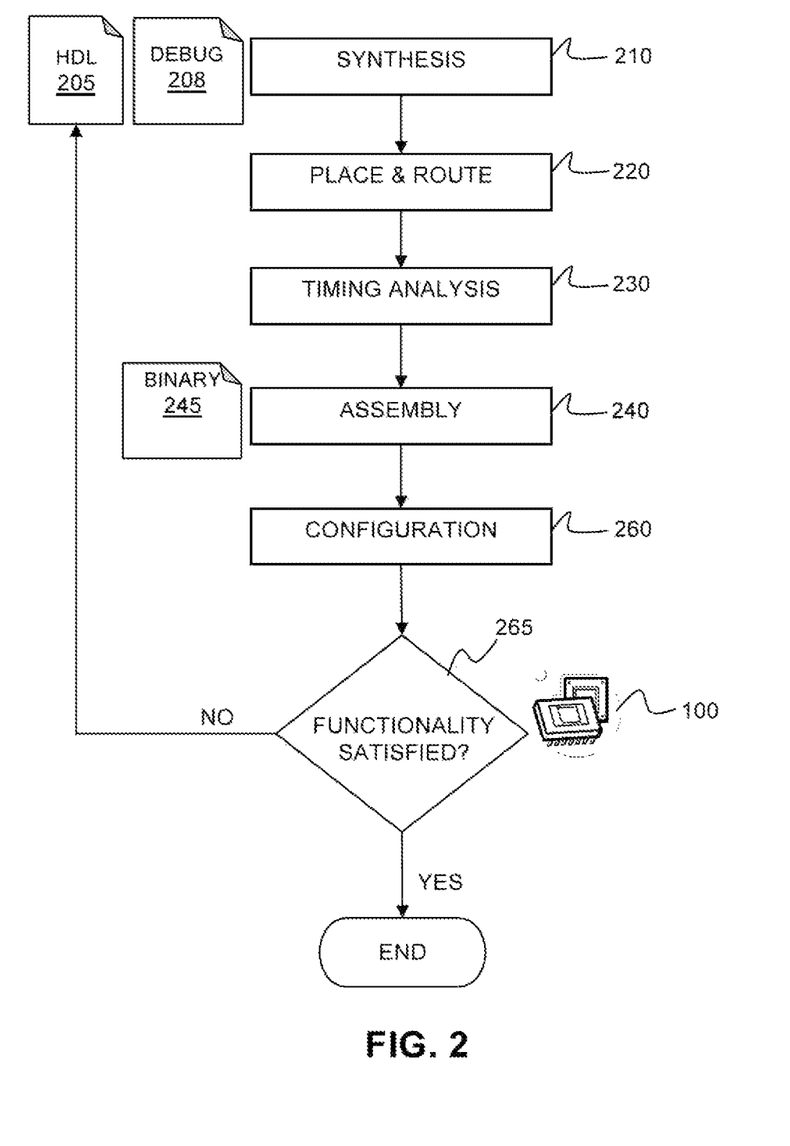
FIG. 2 depicts an illustrative method to create and compile a circuit design for an IC using an EDA tool in accordance with embodiments of the present invention.

FIG. 2 depicts illustrative steps to create and compile a circuit design for an IC device using an EDA tool in accordance with embodiments of the present invention. It should be noted that the EDA tool may include debugging tools that a user may use to verify a circuit design. Accordingly, debugging logic included by the debugging tools may be compiled with the user's circuit design and downloaded into the IC device for analysis.

Generally, a circuit designer or engineer may create a circuit design that is embodied in a hardware description language (HDL) file 205. As mentioned, debugging logic or debugging file 208 may be inserted into the design. Together with debugging file 208, HDL file 205 may be synthesized by the EDA tool during synthesis step 210. For instance, synthesis operation performed at step 210 may translate the circuit design embodied in HDL file 205 and debugging file 208 into a discrete netlist of logic-gate primitives. The synthesized logic gates in the circuit design are then placed and routed on a target IC device during a place and route operation at step 220. Generally, wire nets may be added to connect the logic gates and other components on the target IC device to route signals in the circuit design during the place and route operation at step 220.

After the place and route operation, a timing analysis operation may be performed at step 230. It should be appreciated that the timing analysis operation may compute the delays of different paths in the circuit design and the timing constraints of the overall circuit design. Binary configuration file 245 may then be produced during an assembly operation at step 240. Binary configuration file 245 contains description of the circuit design and may be used to program IC device 100 (e.g., contents of binary configuration file 245 is downloaded into IC device 100) during a configuration operation at step 260.

In one embodiment, after the contents of binary configuration file 245 is downloaded into the IC device, IC 100 may be debugged at step 265 to ensure that the user's desired functionality is satisfied and that the circuit design is operating correctly. In one embodiment, a host system (e.g., a computer system) may establish a debug connection with the IC device via a PCIe bus. If the compiled design satisfies the user's desired functionality, the circuit design process is complete at this stage. Otherwise, the user may modify or update HDL file 205 and the updated circuit design may be recompiled and steps 210-265 may be repeated until the desired functionality is achieved (e.g., when existing errors in the circuit design are corrected).

Figure 3:
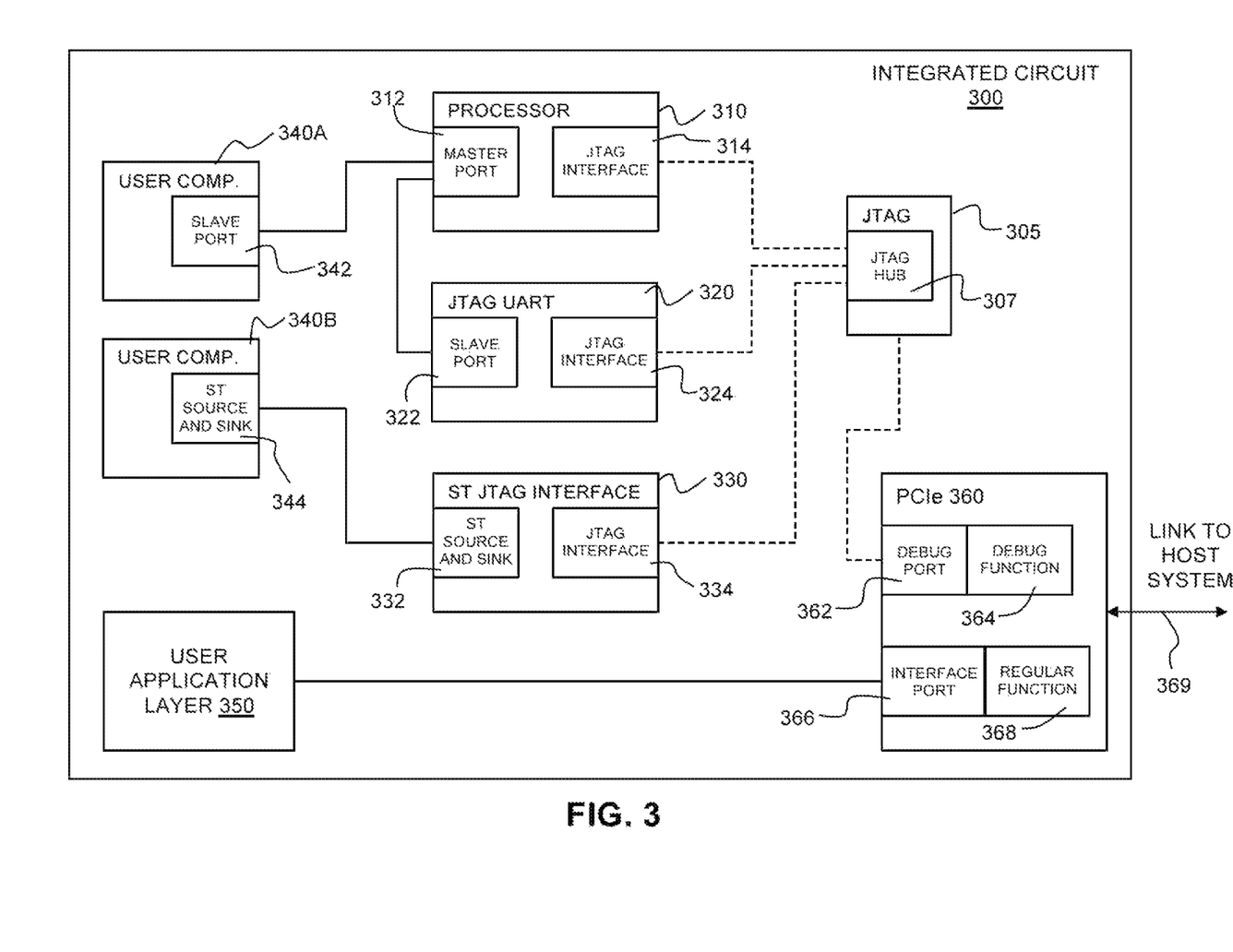
FIG. 3 shows an illustrative integrated circuit with debug circuitry and interface circuitry with a dedicated debug port in accordance with embodiments of the present invention.

FIG. 3 shows illustrative IC 300 with debug circuitry and interface circuitry with a dedicated debug port in accordance with embodiments of the present invention. It should be noted that IC 300 is a simplified block diagram that illustrates certain circuit blocks that may exist in a circuit design and the connections formed between the circuit blocks and the dedicated debug port to allow a user debug access to some of these circuit blocks.

As shown in FIG. 3, IC 300 includes a Joint Test Action Group (JTAG) interface 305. JTAG interface circuitry 305 may include a controller circuit (not shown) and JTAG hub 307 that may be used to connect to user-defined circuits on IC 300. As different circuits or elements in IC 300 may need to communicate via JTAG interface 305, JTAG hub 307 is an arbitration circuit (e.g., a multiplexing circuit) that handles the transmission of signals from the different circuits to JTAG interface circuitry 305. As is generally known, the JTAG interface may connect an IC device, such as IC 300, to a host computer system, and is widely used for debugging and boundary scan testing purposes.

In the embodiment of FIG. 3, instead of using JTAG interface circuitry 305 to debug circuitry within IC 300, IC may be linked to a host computer system via PCIe interface circuit 360 (or other similar high-speed interfaces). PCIe interface circuit 360 may include a debug function block 364 coupled to a dedicated debug port 362, and a regular function block 368 coupled to an interface port 366. It should be appreciated that PCIe interface circuit 360 may include a transaction layer, a data link layer, and a physical layer, among others, that are not shown in FIG. 3. The transaction layer manages communication with the application layer and related transceiver channels. The data link layer, generally located between the physical layer and the transaction layer, manages packet transmission and maintains data integrity by generating and checking cycling redundancy code (CRC) during data reception. Further details of the different layers in the complete PCIe protocol stack are not described herein in order to not obscure the present invention.

In one embodiment, regular function block 368 in PCIe interface circuit 360 may receive and transmit regular user data packets (e.g., non-debugging signals) via connection 369 (and core functionality layers such as the transaction layer, data link layer, and physical layer). The received regular user data packets may be transmitted via interface port 366 to user application layer circuit 350 within IC 300. It should be appreciated that this is merely an example that shows how signals received via PCIe interface circuit 360 may be transmitted to other parts of IC 300. Further details on the actual operation of the PCIe interface when processing regular user data packets are not provided herein in order to not unnecessarily obscure the present invention.

When IC 300 is receiving debugging signals (e.g., from the host computer system via connection 369), debugging function block 364 may be used to access dedicated debug port 362. In one embodiment, dedicated debug port 362 may be a memory-mapped port (an address-based read/write interface) in PCIe interface circuit 360 that allows debugging connections (shown as dotted lines in FIG. 3) to be added by an EDA tool (e.g., during a circuit design compilation process as outlined above with reference to FIG. 2) without modifying the existing user design. Accordingly, debug function 364 may allow a driver on the PCIe root complex to access dedicated debug port 362, details of which will be explained later with reference to FIG. 4). As such, debugging signals received from the host computer system via connection 369 may be transmitted to other parts of IC 300 via dedicated debug port 362.

As shown in FIG. 3, a debugging connection or debugging path is formed (e.g., an EDA tool as described with reference to FIG. 2 may automatically insert the debugging connection during compilation) between dedicated debug port 362 and JTAG interface circuit 305. As such, PCIe interface 360 may have access to other JTAG interfaces in various components on IC 300. In the embodiment of FIG. 3, IC 300 includes processor circuit 310, JTAG Universal Asynchronous Receiver/Transmitter (UART) circuit 320, and streaming JTAG interface circuit 330 that communicate with JTAG interface logic 305, and user components 340A and 340B. Each circuit (e.g., processor circuit 310, JTAG UART circuit 320, and ST JTAG interface circuit 330) that connects to JTAG interface circuitry 305 may have its own JTAG interface logic (e.g., JTAG interfaces 314, 324, and 334, respectively).

Processor circuit 310 may be an embedded processor that is implemented with programmable logic elements (e.g., LEs 117 of FIG. 1) and memory blocks (not shown) in IC 300. The design of processor circuit 310 may thus be tailored to a user's application or design requirements. JTAG UART circuit 320 may be an interface that allows serial communication streams to be transmitted between an external device (e.g., a computer host system that is coupled to IC 300) and processor circuit 310. Other circuits on IC 300 such as processor circuit 310 may communicate with JTAG UART circuit 320 by reading from and writing to control and data registers (not shown) within JTAG UART circuit 320.

It should be noted that processor circuit 310 may include a master port 312 that is coupled to a slave port 322 on JTAG UART Processor circuit 310. Master port 312 may also be coupled to a slave port 342 on a user component 340A. Streaming JTAG interface may include a streaming source and sink interface 332 (an interface that supports the unidirectional flow of data such as multiplexed streams, packets etc.) that is coupled to a corresponding streaming source and sink interface 344 on user component 340B. In one embodiment, user components 340A and 340B may be circuit blocks in a compiled user design in IC 300.

Even though specific circuit components are shown in FIG. 3, different circuits may be present on an IC device such as IC 300. For example, there may be multiple JTAG UART circuits communicating with JTAG interface circuit 305 and processor circuit 310. Therefore, it should be noted that IC 300 shown in FIG. 3 is merely an illustrative example of how a high-speed input-output interface such as PCIe interface circuit 360 may be used to provide debugging access (via various debugging connections) to different circuit elements on IC 300. As such, further details of these circuit elements (processor circuit 310, JTAG UART circuit 320, ST JTAG interface circuit 330, and user components 340A and 340B) are not shown and described in detail herein in order to not obscure the present invention.

Figure 4:
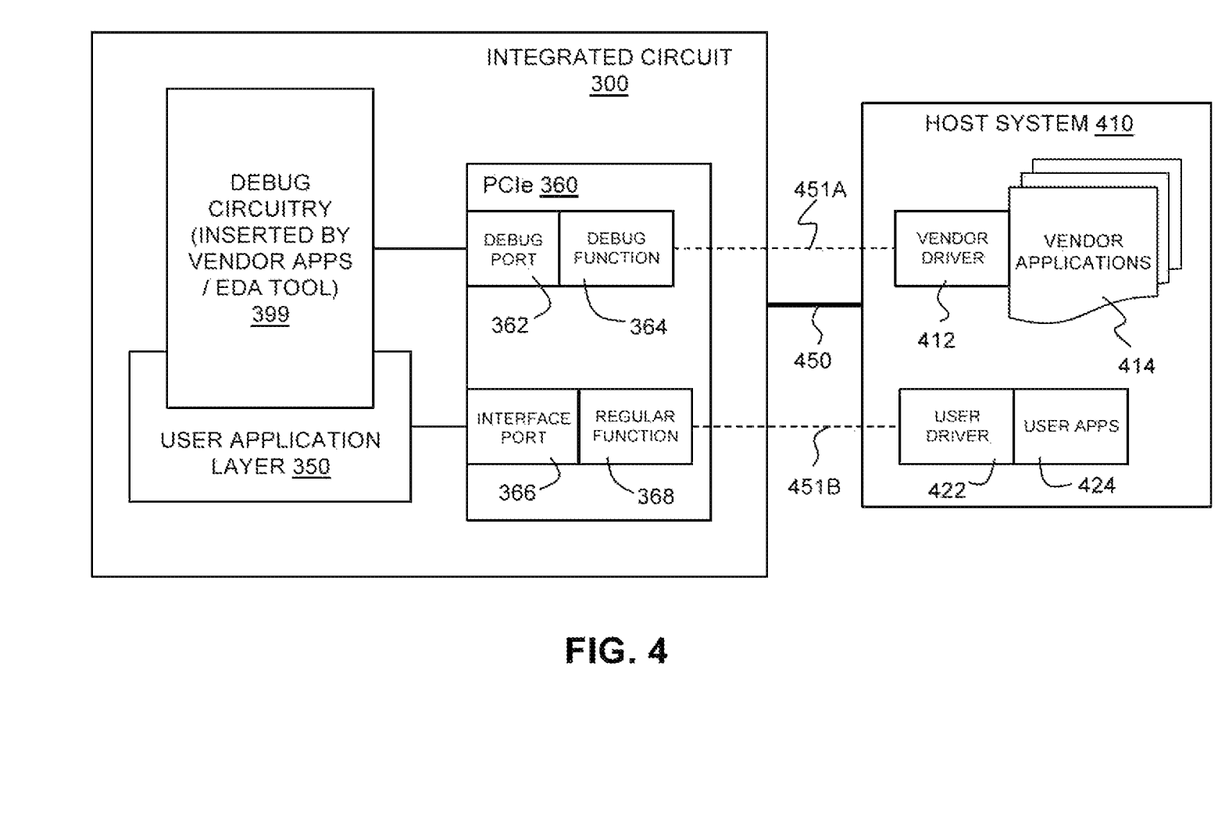
FIG. 4 is an illustrative block diagram that shows a host system with software drivers and applications coupled to an integrated circuit device in accordance with embodiments of the present invention.

FIG. 4 is an illustrative block diagram that shows a host system with software drivers and applications coupled to an IC device in accordance with embodiments of the present invention. In FIG. 4, host system 410 (e.g., a computer) is coupled to IC 300 via physical connection 450. In one embodiment, physical connection 450 may be a PCIe cable or connector (PCIe card slot, etc.) that connects host system 410 to IC 300 (or more specifically PCIe interface circuit 360 on IC 300). As such, host system 410 may include a root complex device (not shown) that generates transaction requests for host system 410 to access dedicated debug port 362 in IC 300.

FIG. 4 shows a variety of applications on host system 410, such as vendor applications 414 and user applications 424, that may interact with IC 300. These applications may include their own set of software drivers. It should be noted that the software drivers may provide an interface for the respective applications on the host system 410 to access the application or design in the end device (IC 300). For example, vendor driver 412 allows vendor applications 414 to communicate with IC 300 while user driver 422 allows user apps 424 to communicate with IC 300.

Vendor applications 414 on host system 410 may be, among others, an EDA tool and debugging tools provided by the vendor of IC 300. As an example, a user may create a circuit design using an EDA tool (one of vendor applications 414) on host system 410, compile that design, and program or configure the targeted device (e.g., IC 300) via physical connection 450 (e.g., a USB cable, a PCIe port, etc.). In one instance, the same EDA tool may include a debugging tool (in other instances, a separate debugging tool may be used) to debug the circuit design loaded on IC 300 via physical connection 450. Accordingly, user applications 424 may include any application that interacts with the user design on IC 300 via PCIe interface circuit 360.

As shown in FIG. 4, PCIe interface circuit 360 on IC 300 includes a dedicated debug function block 364 and a regular function block 368. Generally, a PCIe interface function (e.g., debug function 364 or regular function 368 within PCIe interface circuit 360) may include identification registers (not shown) that allow the system software on host system 410 (e.g., an operating system on host system 410) to identify the targeted function (in the PCIe interface) in order to select an appropriate driver to communicate with IC 300.

As an example, the identification registers in regular function block 368 may be configured with user specific values to allow user driver 422 to be started in order for user applications 424 to communicate with IC 300 via PCIe interface circuit 360. Accordingly, in one embodiment, the identification registers in debug function 364 may be configured with vendor specific values (e.g., vendor device identification number, etc.) to allow vendor driver 412 to be selected. Subsequently, vendor applications 414 will be able to access debug circuitry 399 in IC 300 via the same PCIe interface circuit 360.

As shown in FIG. 4, logical connections 451A and 451B (shown as dotted lines) within physical connection 450 connect different applications and drivers on host system 410 to their respective functions on PCIe interface circuit 360 on IC 300. Therefore, when a user uses a debugging tool from any of the available vendor applications 414 to debug IC 300, vendor driver 412 connects the selected vendor application 414 to dedicated debug function 364 (shown as logical connection 451A). Debugging signals received by debug function 364 are accordingly transmitted to debug circuitry 399 via dedicated debug port 362. In one embodiment, debug circuitry 399 may be automatically inserted by the selected vendor application 414 (e.g., debugging connections shown as dotted lines in FIG. 3).

Accordingly, when the user accesses IC 300 with any of user applications 424, user driver 422 connects the selected user application 424 to regular function block 368 (shown as logical connection 451B). As mentioned above with reference to FIG. 3, regular function block 368 may receive and transmit regular user data packets between IC 300 and host system 410. The received regular user data packets may then be transmitted from PCIe interface circuit 360 to user application layer circuit 350 via interface port 366. It should be appreciated that even though only debug function block 364 and regular function block 368 are shown in FIGS. 3 and 4 there may be a variety of function blocks that exist in PCIe interface circuit 360 and there may be one instance of corresponding driver software for each function block in PCIe interface circuit 360.

As PCIe interface circuit 360 includes a dedicated debug function 364, a user may be able to access debug circuitry 399 and debug IC 300 even when user data packets are being transmitted by user applications 424. That is, debugging data signals and user data packets from vendor applications 414 and user applications 424, respectively, may be transmitted to IC 300 via physical connection 450. In one embodiment, having a dedicated debug port 362 in PCIe interface circuit 360 allows debug circuitry 399 to be added to IC 300 without affecting the user design because connections are made from debug circuitry 399 to dedicated debug port 362 and not user interface port 366. Additionally, as a dedicated debug function 364 is used, the user driver 422 may not be affected because a different driver (in this case, vendor driver 412) is used to allow vendor applications 414 to access debug circuitry 399 in IC 300.

Figure 5:
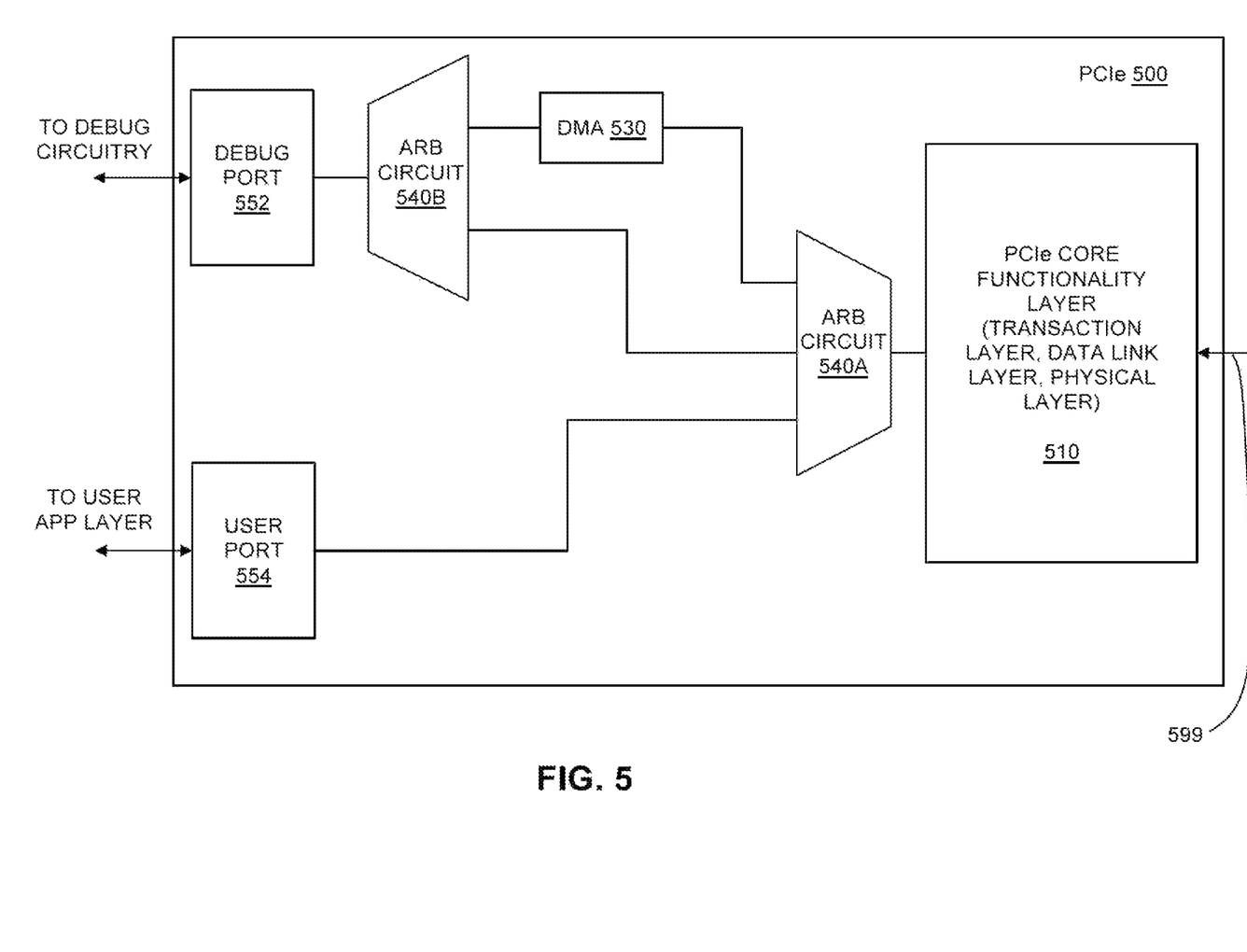
FIG. 5 shows a Peripheral Component Interconnect Express (PCIe) interface circuit without a dedicated debug function in accordance with embodiments of the present invention.

While having a dedicated debug function in a PCIe interface circuit may allow an IC device to be debugged via a PCIe connection, there may be times when it may not be cost effective to have a dedicated debug function (e.g., when logic resources in an IC device are limited). FIG. 5 shows a PCIe interface circuit without a dedicated debug function in accordance with embodiments of the present invention. In FIG. 5, PCIe core functionality layer 510 is coupled to debug port 552 and user port 554 via arbitration circuits 540A and 540B.

Debug port 552 may be a dedicated debug port that provides debugging access to debug circuitry within the device, similar to debug port 362 of FIGS. 3 and 4. However, unlike PCIe interface circuit 360 shown in the embodiments of FIGS. 3 and 4, PCIe interface circuit 500 does not include a dedicated debug function block (e.g., debug function block 364 of FIGS. 3 and 4). Therefore, in one embodiment, in order to support debugging access via a PCIe link, PCIe interface circuit 500 may need to allow a user specified portion of the device memory space to be redirected to dedicated debug port 552.

As shown in FIG. 5, PCIe core functionality layer 510 is coupled to arbitration circuit 540A. It should be appreciated that PCIe core functionality layer 510 may include a transaction layer, a data link layer, and a physical layer, among others, for handling data packet transmissions. The actual operation of the layers in the PCIe protocol stack is not described in detail in order to not obscure the present invention. When PCIe interface circuit 500 receives a data packet from physical link 599 (e.g., a PCIe cable, a PCIe connector, etc.), the data packet may be transmitted through PCIe core functionality layer 510 to arbitration circuit 540A. Accordingly, arbitration circuit 540 may transmit the received data packet either to DMA circuit 530, directly to arbitration 540B, or user port 554.

When the received data packet contains regular user data signals (e.g., non-debugging signals), arbitration circuit 540A may transmit the data packet to user port 554. The user data signals may then be transmitted to the user application layer (not shown) via user port 554. When the received data packet contains debugging signals, arbitration circuit 540A may transmit the received data packet to dedicated debug port 552 via arbitration circuit 540B. The debug signals may then be transmitted from debug port 552 to debug circuitry in the IC device. It should be noted that most PCIe host central processing units (CPU) may only issue four-byte or eight-byte memory read and write operations to connected PCIe devices (e.g., PCIe interface circuit 500). Therefore, for an improved throughput, a DMA controller 530 may be included in PCIe interface circuit 500.

In one embodiment, the data packet received at PCIe core functionality layer 510 via physical link 599 may contain a few relatively small PCIe transactions. Accordingly, arbitration circuit 540A may transmit the received PCIe transactions or instructions to DMA circuit 530. The received PCIe instructions may be used to configure DMA circuit 530, which may then generate larger PCIe transactions for faster data transfer. For example, DMA circuit 530 may issue read/write requests to debug circuitry within the device. As shown in FIG. 5, the read/write requests may be transmitted by arbitration circuit 540B to dedicated debug port 552 before being transmitted to the debug circuitry.

In one embodiment, arbitration circuits 540A and 540B include multiplexing and demultiplexing circuits. Accordingly, regular user signals and debugging signals generated by the device may be received respectively by user port 554 and debug port 552. Arbitration circuits 540A and 540B may then transmit the respective signals to PCIe core functionality layer 510 for the signals to be transmitted out of the device via physical link 599.

Figure 6:
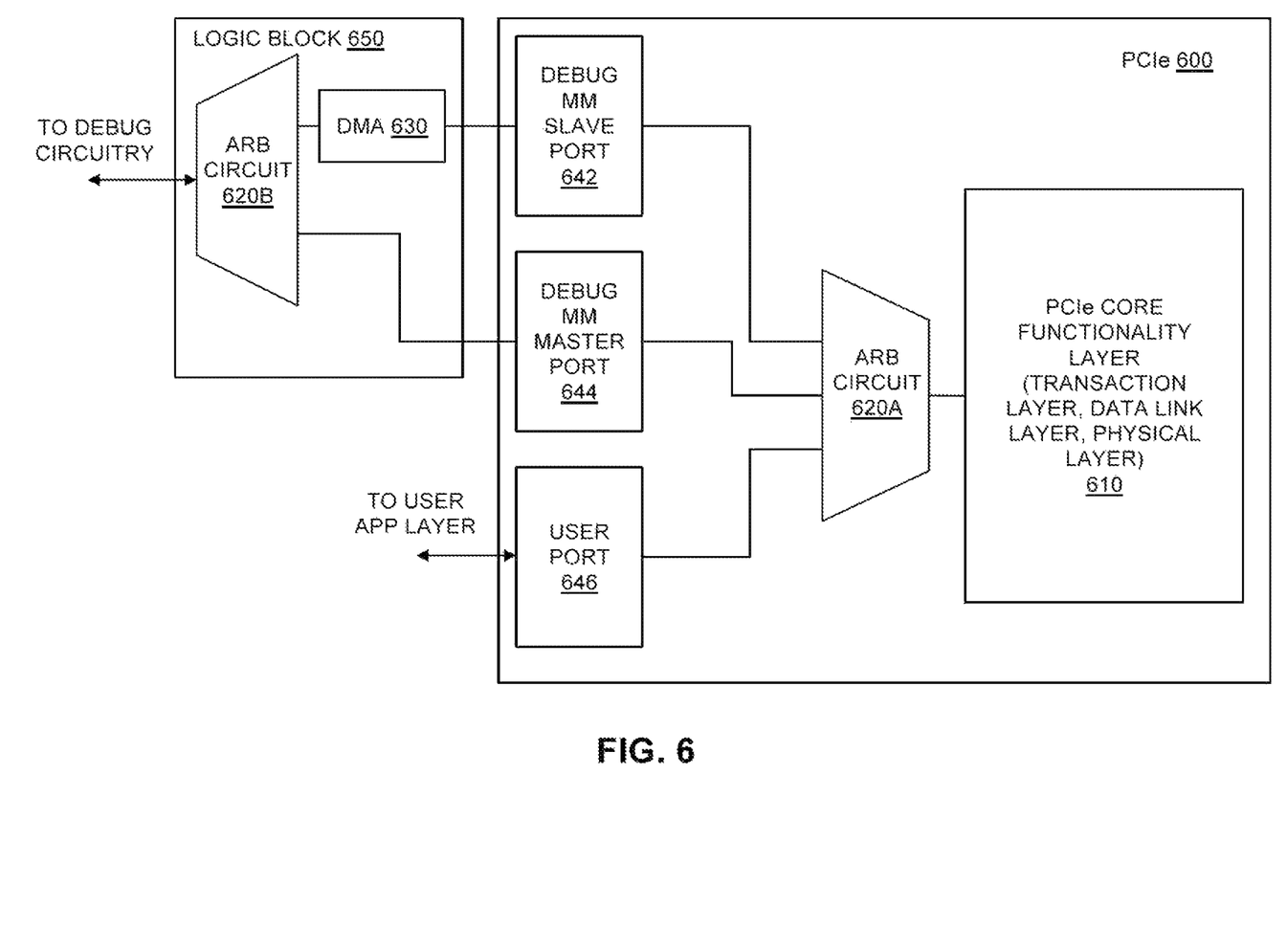
FIG. 6 shows a PCIe interface circuit coupled to a logic block with a direct memory access (DMA) circuit in accordance with embodiments of the present invention.

FIG. 6 shows PCIe interface circuit 600 coupled to logic block 650 with DMA circuit 630 in accordance with embodiments of the present invention. It should be appreciated that PCIe interface circuit 600 shares similarities with PCIe interface circuit 500 of FIG. 5 and as such, elements that have been described above (e.g., PCIe core functionality layer 610, user port 646, arbitration circuits 620A and 620B, etc.) are not described in detail again. Instead of embedding a DMA circuit in PCIe interface circuit 600, DMA circuit 630 may be automatically inserted as part of logic block 650 (e.g., inserted by an EDA tool and compiled as part of the configuration to be loaded on the device). In one embodiment, the functionality of DMA circuit 630 may be customized based on the debug circuitry being inserted into the device.

As explained, PCIe core functionality layer 610 may receive data packets from an external element (not shown). If a received data packet contains user data signals, arbitration circuit 620A may transmit the signals to user port 646 before the signals are subsequently transmitted to the user application layer (not shown in FIG. 6). As shown in FIG. 6, PCIe interface circuit 600 includes two dedicated debug ports, namely, debug memory-mapped slave port 642 and debug memory-mapped master port 644. It should be noted that memory-mapped master interface ports may initiate transfers while memory mapped slave interface ports may respond to transfer requests.

When a received data packet contains debugging signals or transactions, arbitration circuit 620A may route the signals to either debug memory-mapped master port 644 (if the data packet contains debugging signals directed to debug circuitry), or debug memory-mapped slave port 642 (if the data packet contains multiple PCIe transactions to program DMA circuit 630). In FIG. 6, debug memory-mapped slave port is coupled to DMA circuit 630, or more specifically a master port (not shown) on DMA circuit 630. DMA circuit 630 may thus initiate large data transfer transactions via PCIe interface circuit 600. Accordingly, DMA 630 may either issue read requests to read data from debug circuitry (not shown) on the device or write packets to PCIe interface circuit 600 via debug memory-mapped slave port 642. Arbitration circuit 620B in logic block 650 may accordingly route signals from either debug memory-mapped master port 644 or debug memory-mapped slave port 642 to debug circuitry on the device, and route signals from the debug circuitry back to either of the two debug ports.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit comprising:
   high speed serial interface circuitry having a function circuit block that receives a data packet from external circuitry; and
   a dedicated debug port in the high speed serial interface circuitry coupled to the function circuit block that transmits the received data packet to debug circuitry on the integrated circuit.

2. The integrated circuit defined in claim 1, wherein the high speed serial interface circuitry comprises a peripheral component interconnect express (PCIe) interface.

3. The integrated circuit defined in claim 2, wherein the function circuit block comprises a dedicated debug function circuit block in the PCIe interface, wherein the external circuitry comprises a root complex module, and wherein the dedicated debug function circuit block allows the root complex module to access the dedicated debug port.

4. The integrated circuit defined in claim 3, wherein the data packet comprises debugging signals, and wherein the high speed serial interface circuitry further comprises:
   a user function circuit block that receives a user data packet from the external circuitry; and
   a user port in the high speed serial interface circuitry that transmits the received user data packet to user circuitry on the integrated circuit.

5. The integrated circuit defined in claim 1 further comprising:
   a joint test action group (JTAG) circuit block coupled to the dedicated debug port, wherein the received data packet is transmitted from the dedicated debug port to the debug circuitry via the JTAG circuit block.

6. The integrated circuit defined in claim 1, wherein the data packet comprises a debug data packet, and wherein the function circuit block comprises a user function circuit block that is adapted to receive one of the debug data packet and a user data packet, the integrated circuit further comprising:
   arbitration logic circuitry coupled to the function circuit block, wherein the arbitration logic circuitry selectively transmits the user data packet to a user port in the high speed serial interface circuitry, and selectively transmits the debug data packet to the dedicated debug port.

7. The integrated circuit defined in claim 6, further comprising:
   a direct memory access (DMA) controller in the high speed serial interface circuitry; and
   additional arbitration logic circuitry coupled to the dedicated debug port, wherein the additional arbitration logic circuitry receives the debug data packet at a first input and an output from the DMA controller, and wherein the additional arbitration logic circuitry selectively transmits one of the debug data packet and the output from the DMA controller to the dedicated debug port.

8. The integrated circuit defined in claim 6, wherein the dedicated debug port comprises a master port, wherein the high speed serial interface circuitry further comprises a slave port, and wherein the arbitration logic circuitry selectively transmits a plurality of configuration instructions to the slave port.

9. The integrated circuit defined in claim 8 further comprising:
   a direct memory access (DMA) controller that receives the plurality of configuration instructions from the slave port; and
   additional arbitration logic circuitry that receives the debug data packet from the master port, and that receives an output from the DMA controller, and wherein the additional arbitration logic circuitry selectively transmits one of the debug data packet and the output from the DMA controller to the debug circuitry.

10. The integrated circuit defined in claim 1, wherein the dedicated debug port comprises a memory mapped master port.

11. A method for providing debugging capability in an integrated circuit, the method comprising:
providing a dedicated debug port in a high speed serial interface circuit on the integrated circuit;
providing a function block to access the dedicated debug port in the high speed serial interface circuit; and
compiling a user design with debug circuitry to form a plurality of debugging paths from the debug circuitry in the user design to the dedicated debug port.

12. The method defined in claim 11 further comprising:
inserting the debug circuitry in the user design prior to compiling the user design.

13. The method defined in claim 11, wherein the high speed serial interface circuit comprises a peripheral component interconnect express (PCIe) interface circuit that is adapted to receive user data packets and debugging signals, wherein the function block comprises a dedicated debug function block, and wherein the user design comprises a plurality of user application circuit blocks, the method further comprising:
providing a user port in the high speed serial interface circuit;
providing a user function to access the user port; and
forming a plurality of user signal paths from the user port to the plurality of user application circuit blocks when compiling the user design.

14. The method defined in claim 11 further comprising:
providing a direct memory access (DMA) controller in the high speed serial interface circuit to access the dedicated debugging port.

15. The method defined in claim 11 further comprising:
providing a user port in the high speed serial interface circuit; and
providing an arbitration logic circuit to selectively couple an output of the function block to one of the user port and the dedicated debug port.

16. A method of operating an integrated circuit, the method comprising:
receiving debugging signals from external circuitry at a dedicated debug function circuit block in a high speed serial interface circuit;
transmitting the debugging signals to a dedicated debug port in the high speed serial interface circuit; and
with the dedicated debug port in the high speed serial interface circuit, transmitting the debugging signals to debug circuitry in the integrated circuit.

17. The method defined in claim 16, wherein the high speed serial interface circuit comprises a peripheral component interconnect express (PCIe) interface circuit, the method further comprising:
with the debugging circuitry, performing a debug operation on the integrated circuit using the debugging signals; and
with a user function circuit block in the PCIe interface circuit, receiving a data packet while performing the debug operation.

18. The method defined in claim 16, wherein the dedicated debug port comprises a memory mapped master port, and wherein transmitting the debugging signals to the debug port comprises:
transmitting the debugging signals with a direct memory access (DMA) controller circuit in the high speed serial interface circuit.

19. The method defined in claim 18 further comprising:
configuring the DMA controller circuit prior to transmitting the debugging signals.

20. The method defined in claim 16, wherein transmitting the debugging signals to debug circuitry in the integrated circuit comprises:
with the dedicated debug port, transmitting the debugging signals to a joint test action group (JTAG) circuit block coupled to the dedicated debug port; and
with the JTAG circuit block, transmitting the debugging signals to the debug circuitry.

* * * * *